United States Patent [19]

Trenkler et al.

[11] Patent Number: 4,890,083
[45] Date of Patent: Dec. 26, 1989

[54] SHIELDING MATERIAL AND SHIELDED ROOM

[75] Inventors: George Trenkler, Providence, R.I.; Richard G. Delagi, Sharon, Mass.; Francois A. Padovani, Westwood, Mass.; Donald L. Winslow, Raynham, Mass.

[73] Assignee: Texas Instruments Incorporated, Dallas, Tex.

[21] Appl. No.: 260,048

[22] Filed: Oct. 20, 1988

[51] Int. Cl.$^4$ ............................................. H01F 7/00
[52] U.S. Cl. ................................. 335/301; 335/304; 324/320
[58] Field of Search ................ 335/296, 301, 304; 324/318, 319, 320

[56] References Cited

U.S. PATENT DOCUMENTS

| | | | |
|---|---|---|---|
| 3,212,865 | 10/1965 | Miller | 29/196.3 |
| 3,555,169 | 1/1971 | Miller | 174/36 |
| 3,756,788 | 9/1973 | Whetstone | 335/301 |
| 4,156,882 | 5/1979 | Delagi et al. | 360/126 |
| 4,646,046 | 2/1987 | Vavrek et al. | 335/301 |
| 4,797,646 | 1/1989 | Saji et al. | 335/301 |
| 4,803,452 | 2/1989 | Saji et al. | 335/301 |

Primary Examiner—George Harris
Attorney, Agent, or Firm—James P. McAndrews; John A. Haug; Melvin Sharp

[57] ABSTRACT

A shield for electromagnetic radiations comprising a laminated sheet having exterior layers of copper which sandwich an interior layer of a ferromagnetic alloy taken from the class consisting of nickel-iron compounds having from about 42 to about 80 percent nickel by weight and iron as a substantial portion of the remaining material. The layers are metallurgically bonded to each other by sintering or the like. According to a second embodiment, a laminated sheet is provided having exterior layers of copper which sandwich plural interior layers of ferromagnetic material, the layers of ferromagnetic material having progressively higher permeability and being capable of shielding interference of progressively lower energy level when travelling in a direction away from the direction of the source of interference. A typical laminated sheet in the direction away from the source of interference is copper/permendur/80/copper. A further typical such laminated sheet in the direction away from the source of interference is copper/49/80/copper. In those instances where it is known that no high frequencies will be encountered, the copper layers can be removed. It is necessary that each successive layer in the direction away from the source of interfering electromagnetic radiations be at maximum permeability range at a lower interference energy level.

32 Claims, 4 Drawing Sheets

GRADED MATERIAL U VALUES
FROM INTIAL $U_0$ TO THE $U_s$ (SATURATION)
FOR SINGLE LAYERS OF THE COMPOSITE

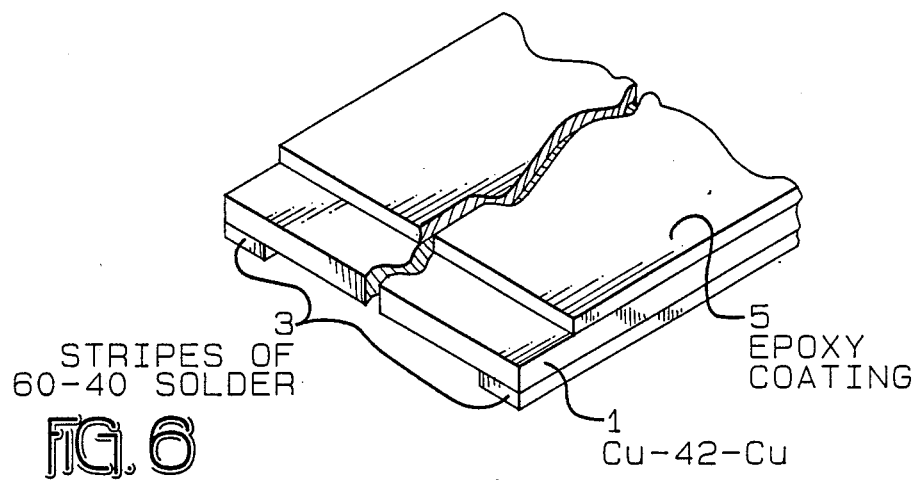
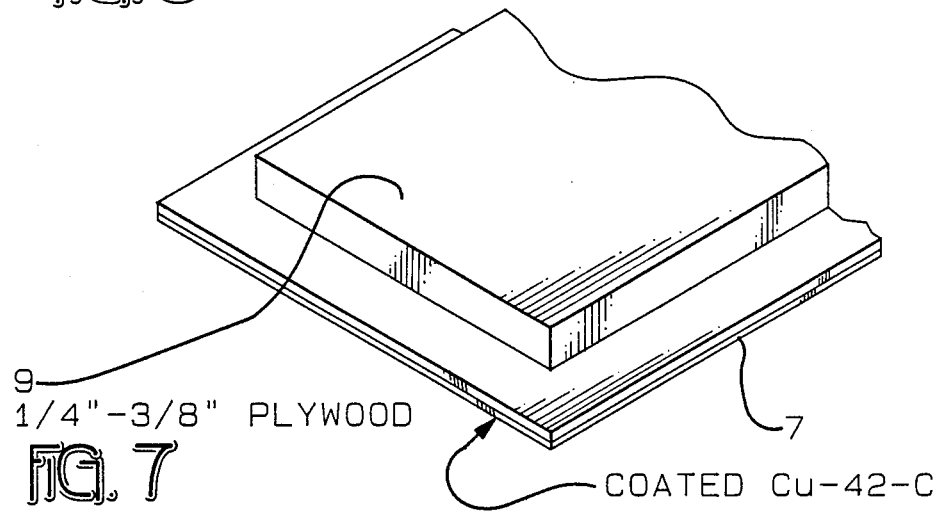
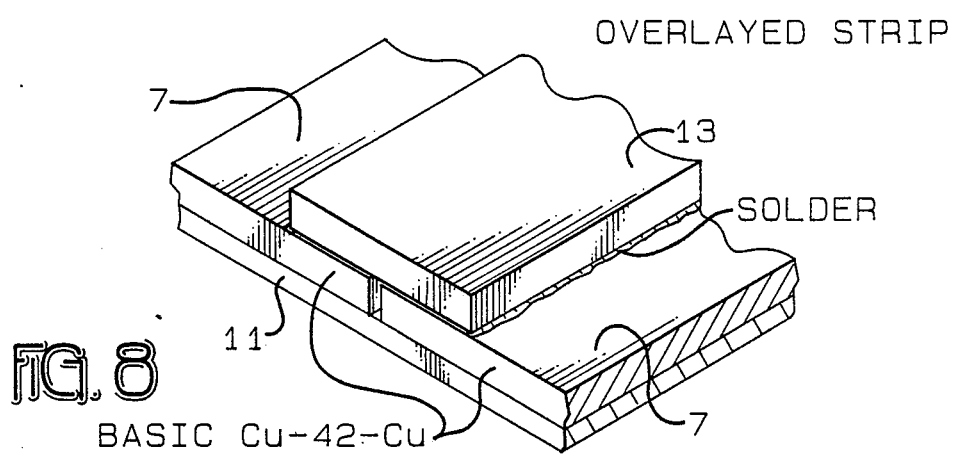

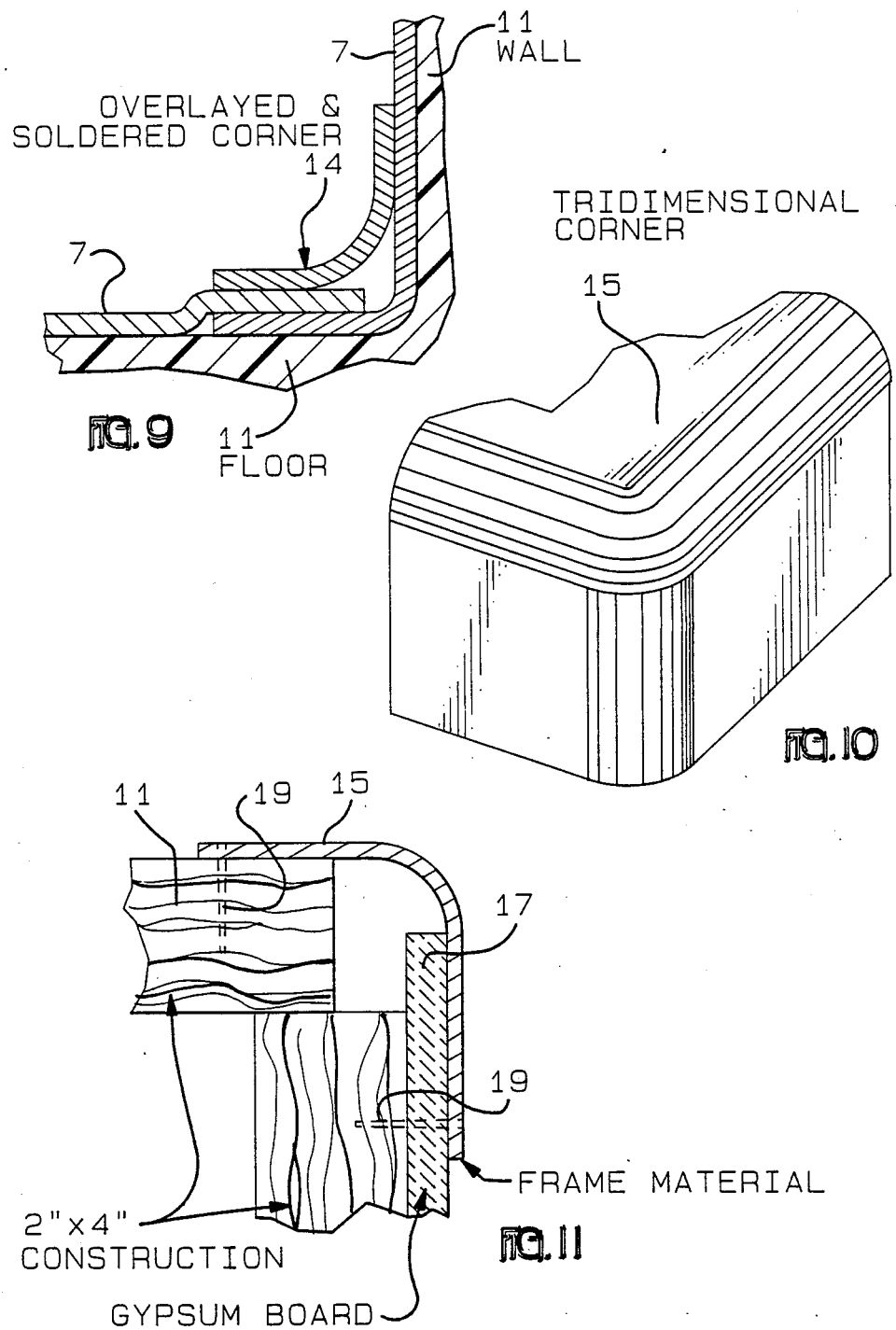

SHIELDING MATERIAL AND SHIELDED ROOM

BACKGROUND OF THE INVENTION

1. Field of the Invention

This invention relates to materials for shielding against electromagnetic radiation and a shielded room and, more specifically, to shielding material capable of shielding against electric fields and electromagnetic radiations of both high and low frequency as well as such radiations of both low and high energy level and a room shielded therewith.

2. Brief Description of the Prior Art

The problem of shielding against or attenuating electromagnetic radiations of the type generally known as interference has been well known and documented in the literature for many years. Such interference can be of many types and can have a narrow or wide frequency range, such as, for example, low frequency (up to about 10K Hertz) of the type emanating from an electric light bulb (60 Hertz), high frequency (greater than about 10K Hertz) of the type emanating from a computer or the like or combinations thereof. Such interference can also have high energy levels or low energy levels. Many different procedures for shielding against such radiation have been developed over the years with varying degrees of success. No single shielding material is fully effective against all types of interference of the type set forth above. It therefore is and has long been and will continue to be a need of the art to provide ever better shielding materials to shield against all of the types of interference enumerated hereinabove.

Shielding of interference from electromagnetic radiation has been found useful if not necessary in many environments, such as, for example, shielding of electrical cable, shielding of rooms wherein it is necessary to minimize interference, etc.

It is known that highly electrically conductive materials provide excellent shielding properties against high frequency interference. Such materials and especially copper have been used to shield out or attenuate high frequency electromagnetic radiations. It is also known that ferromagnetic materials provide excellent shielding properties against low frequency interference. Such materials and especially permalloy (iron-nickel alloy) or iron, 9% silicon, 5% aluminum or iron/ aluminum (up to 10% by weight) or iron with 1 to 3% of silicon ("transformer steel") may be used to shield out low frequency electromagnetic radiations. The ferromagnetic materials, however, vary in their shielding ability, the degree of shielding being based upon the permeability of the material and the width of the hysteresis loop. As the ferromagnetic material becomes saturated, its performance as a shield declines. It is therefore essential to avoid saturation in order to provide optimum shielding performance.

Mu metal, which is a copper-nickel-iron alloy having a high permeability and poor saturation properties, has been widely used by itself to provide electromagnetic shielding. Copper foil alone has also been used as a shield for electromagnetic radiations. Furthermore, separate walls of copper and steel have been used to provide shielding for spatial areas.

Metallurgically bonded copper/stainless steel/copper laminates have been known in the prior art for use in connection with shielding of electromagnetic cables. The stainless steel in such shields is believed to have been used for support strength and rodent protection and not for shielding, 300 series S steels having a so depressed Curie point that they are not magnetic at room temperature. 400 series steels are magnetic, however the presence of chromium depresses the saturation value and widens the hysteresis loop.

U.S. Pat. No. 3,555,169 sets forth a shielding material having inner and outer layers of copper with intermediate layers of stainless steel and low carbon steel.

It has further been known to provide a copper/Invar/copper material for use as heat sink substrates in small printed circuit boards.

Finally, it is known from U.S. Pat. No. 4,156,882 to match materials of different magnetic characteristics in a recording head wherein the layers are insulated from each other with organic materials. This patent relates to the controlled distribution of magnetic lines and not to shielding properties. Insulation between the layers is for the purpose of producing penetration of the whole material, not to the depth of penetration alone.

All of the above noted materials have either not provided the desired shielding properties or have not been used as shielding materials and, even if so used, would not provide shielding properties of the type provided by the shielding materials as disclosed hereinbelow.

As noted above, a further problem in the prior art is that of providing shielded rooms which are free of externally produced interference. A typical design for such room is set forth in U.S. Pat. No. 4,646,046.

It is also known to provide a laminated sheet having exterior layers of copper which sandwich an interior layer of a ferromagnetic alloy taken from the class consisting of nickel-iron compounds having from about 42 to about 80 percent nickel by weight and iron as a substantial portion of the remaining material. Other trace materials, such as but not limited to molybdenum, silicon, manganese can be included. The layers are metallurgically bonded to each other by sintering or the like in well known manner to form the shielding material.

SUMMARY OF THE INVENTION

In accordance with the present invention, there are provided materials for shielding against electromagnetic radiations which provide substantially improved properties over the shielding materials of the prior art.

According to a first embodiment of the invention, there is provided a laminated sheet having exterior layers of copper which sandwich plural interior layers of ferromagnetic material, the layers of ferromagnetic material having progressively higher permeability and being capable of shielding interference of progressively lower energy level when travelling in a direction away from the direction of the source of interference. A typical laminated sheet in the direction away from the source of interference is copper/permendur (49 Co 49 Fe 2V)/49 (49 Ni 50 Fe 1.0–0.5 Si)/80 (80 Ni 15 Fe 5 Mo)/copper. A further typical such laminated sheet in the direction away from the source of interference is copper/49/80/copper. On average, to satisfy the most stringent requirements such as the 100 decibel standard, materials are from about 0.008 to about 0.015 inches thick. The Cu/ferromagnetic/Cu distribution is about 20%/60%/20%. The required thickness of material can be calculated if the attenuation requirements are provided. It is generally easier to determine these requirements empirically by testing a small piece of material in a tester. In those instances where it is known that no high frequencies will be encountered, the copper layers can be removed.

It should be understood that the number of layers of ferromagnetic material can be from two up, it merely being necessary that each successive layer in the direction away from the source of interfering electromagnetic radiations be at its maximum permeability range at a lower interference energy level.

This arrangement is necessary because the interfering electromagnetic radiations are at their highest energy level when entering the shield. It is therefore necessary that the radiations initially strike the layer of ferromagnetic material capable of handling the highest energy level. Since this initially struck layer removes some of the energy from the radiation, the next layer should operate at optimum efficiency when exposed to a lower energy level, etc. for each succeeding layer, if any.

In each of the above examples having copper layers, the high frequencies of the interfering electromagnetic radiation are reflected back by the copper layer whereas the low frequencies are mostly absorbed by the ferromagnetic material layer. In the case of plural ferromagnetic layers, the low frequencies are absorbed by the initial layer encountered until the radiation level is such that the permeability of the initial layer becomes low. At this point, the permeability of the next level becomes high with respect to the energy level of the radiation impinging thereon to provided further absorption of the radiation. This procedure continues in this manner for all further ferromagnetic layers, if present. It should be understood that a possible bimetal effect can be present if the composite metal is not symmetrical.

In accordance with another feature of the present invention, there is provided a shielded room and a venting window therefor which provides greatly improved shielding and which is easily installed to form the shielded room.

Briefly, in accordance with this feature of the present invention, there is provided a room which is formed in standard manner wherein a frame is provided using preferably 2×4s or the like. The frame is sheeted with drywall, plywood or the like. Sheets of the appropriate shielding material, such as, for example, Cu-42-Cu are prepared having a weight ratio of, for example, 20-60-20% and a thickness of, for example, 0.012 inches. It should be understood that these weights and dimensions will be altered as required to suit the particular requirements on a case by case basis. Each sheet of shielding material is provided with a tinned area on one side thereof at a pair of opposed edges. The other side of each sheet of shielding is covered with semiflexible primer and an adhesive is provided thereover.

The prepared sheets of shielding material are then placed on a tray and the adhesive containing surface is covered with a removable material, such as, for example, parchment. The sheet is then placed in the desired position and location against the wall and the removable material is removed. This is continued in the manner of hanging wall paper until the walls of the room are entirely covered. The seams between the sheets are covered with tinned strips of the shielding material and soldered in position to the tinned areas on the sheets. The wall is also covered with adhesive.

The corners between the walls and ceiling or floor are formed as follows:

At each corner, where two sheets of shielding material meet, one sheet is cut to the length exceeding the dimension of the room by 1 to 2 inches. This part of the sheet is bent as to fit the corner and soldered cover the other sheet. The corner is then fitted with contoured trim which is soldered to the sheets covering the wall and ceiling or floor. In the same way, three dimensional corners (i.e., wall, wall and ceiling) are fitted with three dimensional deep drawn corners which later are soldered in their position. All openings in the room are fitted with a frame of Cu-Invar-Cu. The frame material is bent, subsequently annealed and attached to the wooden frame. The degree of shielding is enhanced by attaching the shielding material to the outer wall of the room as to the interior wall as hereinabove described. It is, of course, understood that a metallurgical bond forms a continuous ground connection among all parts of one layer and all parts of an adjacent layer.

Where the shielded room requires a venting window, such window is formed from a pair of spaced frames of the shielding material, each bent in a Z-shape with the end flanges each being perpendicular to the center section. The center sections of each frame are parallel to each other with a flange of each frame being coplanar with a flange of the other frame. A layer of perforated shielding material covers the space between the frames and is soldered to the coplanar flange of each frame. For additional shielding, a spacer is secured to the perforated sheet, such as by soldering, and a second perforated sheet with the perforations preferably staggered from those on the first sheet is secured to the spacer, such as by soldering.

BRIEF DESCRIPTION OF THE DRAWINGS

FIG. 6 is is a partly cut away view of a shielding sheet as provided in accordance with the present invention;

FIG. 7 is an isometric view of the sheet of FIG. 6 secured to a tray for installation;

FIG. 8 is an isometric view of the installed sheets;

FIG. 9 is a cross sectional view of a shielded room corner in accordance with the present invention;

FIG. 10 is an isometric view of a tridemensional corner in accordance with the present invention;

FIG. 11 is a cross sectional view of a completed room corner exterior in accordance with the present invention;

DESCRIPTION OF THE PREFERRED EMBODIMENT

Figure 1:
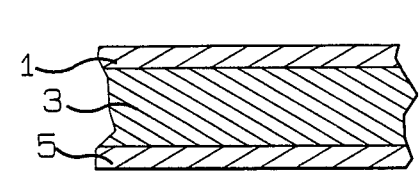
FIG. 1 is a schematic diagram of a shield material for electromagnetic radiations in accordance with a first embodiment of the invention.

Referring first to FIG. 1, there is shown a schematic diagram of a shield material according to the prior art.

The material includes outside layers of highly electrically conductive material 1 and 5, this materially preferably being copper. An intermediate layer 3 is formed of ferromagnetic material having from about 42 to about 80 percent by weight nickel and a substantial portion of the remainder iron. The intermediate layer 3 is chosen in accordance with the expected amount of energy of the electromagnetic radiation to be shielded out. Preferred materials for the layer 3 are 80, 49 and 42 as defined hereinabove. Since the laminate is symmetrical, the electromagnetic radiation can enter from either copper layer 1 or 5 without any difference in performance.

Figure 2:
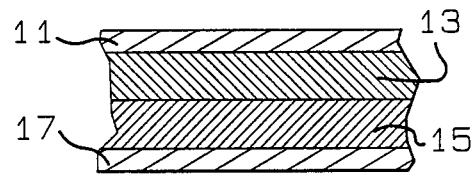
FIG. 2 is a schematic diagram of a shield material for electromagnetic radiations in accordance with a second embodiment of the invention.

Referring now to FIG. 2, there is shown a schematic diagram of a shield material according to a first embodiment of the invention. The material includes outside layers of highly electrically conductive material 11 and 17, this material preferably being copper. Intermediate layers 13 and 15 are formed of ferromagnetic material having from about 42 to about 80 percent by weight nickel and a substantial portion of the remainder iron. In the example of FIG. 2, the layer 13 is formed of 49 and the layer 15 is formed of 80. Accordingly, since the layer 13 of 49 is capable of absorbing much larger amounts of energy without saturating than is the layer 15 of 80, the shield material would be arranged relative to the radiations such that the layer 13 encounters the radiations initially.

Figure 3:
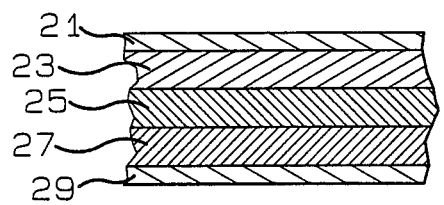
FIG. 3 is a schematic diagram of a shield material for electromagnetic radiations in accordance with a third embodiment of the invention.

Referring now to FIG. 3, there is shown a schematic diagram of a shield material according to a second embodiment of the invention. The material includes outside layers of highly electrically conductive material 21 and 29, this material preferably being copper. Intermediate layers 25 and 27 are formed of ferromagnetic material having from about 42 to about 80 percent by weight nickel and a substantial portion of the remainder iron. The layer 23 is formed of permendur which is by weight 49 percent cobalt, 49 percent iron and 2 percent vanadium. In the example of FIG. 3, the layer 25 is formed of 49 and the layer 27 is formed of 80. Accordingly, since the layer 23 of permendur is capable of absorbing much larger amounts of energy without saturating than is the layer 25 of 49 and the layer 25 of 49 is capable of absorbing much larger amounts of energy without saturating than is the layer 27 of 80, the shield material would be arranged relative to the radiations such that the layer 23 encounters the radiations initially.

Figure 4:
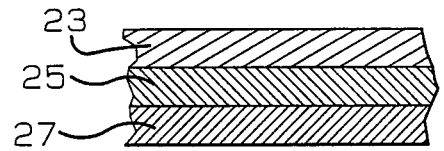
FIG. 4 is a schematic diagram of a shield material for electromagnetic radiations in accordance with a fourth embodiment of the invention.

Referring now to FIG. 4, there is shown a schematic diagram of a shield material according to a third embodiment of the invention. The third embodiment is identical to the second embodiment except for the omission of the copper layer 21 and 29. It should be understood that this third embodiment could also be provided to be identical to the embodiment of FIG. 2 without the copper layers 11 and 17. Also, as in the above described, embodiments, the ferromagnetic material can be other such materials such as those specifically set forth herein, as long as they provide the required properties which are, for low frequency shielding, that the outer material have a higher saturation point and the inside material have a narrow hysteresis loop in order to absorb the remainder of the interference.

Figure 5:
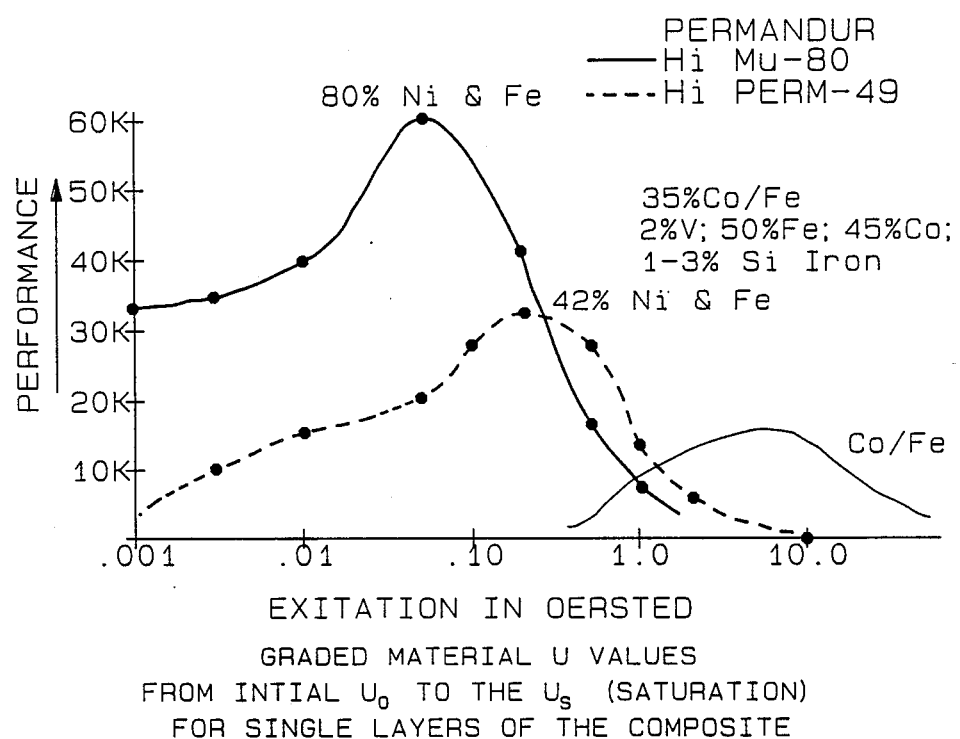
FIG. 5 is a graph of permeability with respect to excitation for several ferromagnetic materials.

Referring now to FIG. 5, there is shown of graph of permeability v. excitation for 80, 49 and permendur. It can be seen that the permendur has high permeability with large excitation, this permeability falling off as excitation decreases. The 49 has low permeability for large excitation and has high permeability at lower excitation in the region whereat the permendur permeability falls off. The 80 has low permeability for large and intermediate excitation and high permeability at very low excitation in the region whereat the 49 permeability falls off. It is therefore readily apparent from the graph of FIG. 5 how the various layers of ferromagnetic material come into play successively to absorb electromagnetic radiation interference in the shield material in accordance with the present invention.

In accordance with another feature of the present invention as set forth in FIGS. 6 through 13, there is provided a shielded room and a venting window therefor which provides greatly improved shielding and which is easily installed to form the shielded room.

Briefly, in accordance with this feature of the present invention, there is provided a room which is formed in standard manner wherein a frame is provided using preferably 2×4s or the like and is sheeted with drywall, plywood or the like in standard manner. Sheets of the appropriate shielding material required for the type of interference expected, such as, for example, Cu-42Cu, are prepared having a weight ratio of, for example, 20-60-20% and a thickness of, for example, 0.012 inches. It should be understood that these weights and dimensions will be altered as required to suit the particular requirements on a case by case basis. Each sheet of shielding material is provided with a tinned area on one side thereof at a pair of opposed edges. The other side of each sheet of shielding is covered with semiflexible primer and an adhesive is provided thereover.

The prepared sheets of shielding material are then placed on a tray and the adhesive containing surface is covered with a removable material, such as, for example, parchment. The sheet is then placed in the desired position and location against the wall and the removable material is removed. This is continued in the manner of hanging wall paper until the walls of the room are entirely covered. The seams between the sheets are covered with tinned strips of the shielding material and soldered in position to the tinned areas on the sheets.

The corners between the walls and ceiling or floor are formed as follows:

At each corner, where two sheets 7 of shielding material meet, one sheet is cut to the length exceeding the dimension of the room by 1 to 2 inches. This part of the sheet is bent to fit the corner and soldered over the other sheet as shown in FIG. 9, using a solder 14 which is also soldered to each sheet 7. The corner is then fitted with contoured trim which is soldered to the sheets covering the walls and ceiling or floor. In the same way, three dimensional corners (i.e., wall, wall and ceiling) are fitted with three dimensional deep drawn corners (FIG. 10) which later are soldered in their position.

Figure 13:
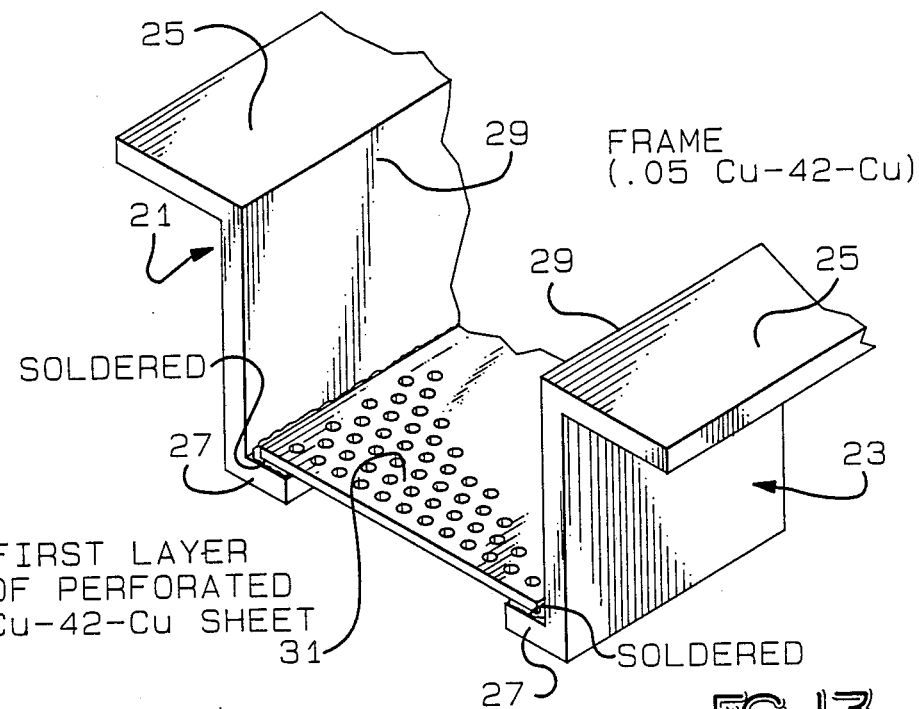
FIG. 13 is an isometric view of a venting window in accordance with the present invention.
Figure 12:
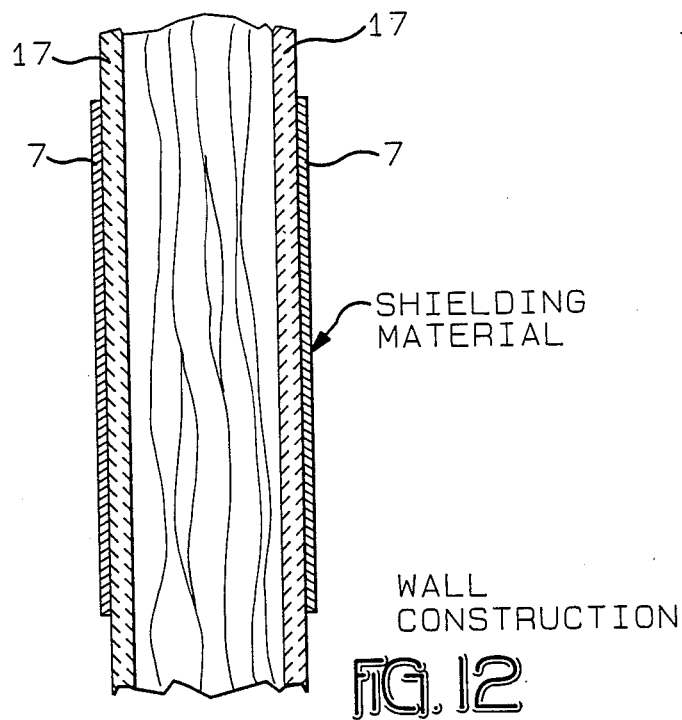
FIG. 12 is a cross section of a wall construction in accordance with the present invention using shielding on both sides of the wall.

All openings in the room are fitted with a frame of Cu-Invar-Cu. The frame material 15 (FIG. 11)is bent, subsequently annealed and attached to the frame. The frame material is made of 0.030 to )0.050 inch Cu-Invar-Cu, formed and annealed and is supplied as a prefabricated "auxiliary" material. Frames 15 are attached to the framing 11 by copper plated screws 19 which are countersunk and soldered to the frame 11. In general, only copper plated nails and screws are utilized. As can be seen from FIG. 12, the degree of shielding is enhanced by attaching the shielding material 7 to the outer wall of the room as well as to the interior wall as hereinabove described. It is, of course, understood that a metallurgical bond forms a continuous ground connection among all parts of one layer and all parts of an adjacent layer.

Where the shielded room requires a venting window, such window is formed, as shown in FIG. 13, from a pair of spaced frames 21 and 23 of the shielding material, each bent in a Z-shape with the end flanges 25 and 27 each being perpendicular to the center section 29. The center sections 29 of the frames are parallel to each other with a flange 27 of each frame being coplanar with a flange 27 of the other frame. A layer of perforated shielding material 31 covers the space between the frames and is soldered to the coplanar flange 27 of each frame. For additional shielding, a spacer (not shown) is secured to the perforated sheet 31, such as by soldering, and a second perforated sheet (not shown) with the perforations preferably staggered from those on the first sheet is secured to the spacer, such as by soldering.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A shield material for electromagnetic radiations comprising:
    (a) a first layer of ferromagnetic material having opposing major surfaces and having a relatively high permeability over a first predetermined electromagnetic energy intensity range;
    (b) a second layer of ferromagnetic material having opposing major surfaces, one of said major surfaces being contiguous with one of the major surfaces of said first layer, said second layer having a relatively high permeability over a second predetermined electromagnetic energy intensity range different from said first range; and
    (c) a layer of highly electrically conductive material on the non-contiguous major surfaces of said first and second layers.

2. A shield material as set forth in claim 1 wherein said second electromagnetic energy intensity range is lower than said first electromagnetic energy intensity range.

3. A shield material as set forth in claim 1 wherein said first layer is taken from the class consisting of permendur and nickel-iron containing alloys having from about 42 to about 80 weight percent nickel.

4. A shield material as set forth in claim 2 wherein said first layer is taken from the class consisting of permendur and nickel-iron containing alloys having from about 42 to about 80 weight percent nickel.

5. A shield material as set forth in claim 1 wherein said layer of highly electrically conductive material is copper.

6. A shield material as set forth in claim 2 wherein said layer of highly electrically conductive material is copper.

7. A shield material as set forth in claim 3 wherein said layer of highly electrically conductive material is copper.

8. A shield material as set forth in claim 4 wherein said layer of highly electrically conductive material is copper.

9. A shield material for electromagnetic radiations comprising:
    (a) a laminated member comprising a plurality of contiguous layers of ferromagnetic material, each said layer of ferromagnetic material having a predetermined high permeability over a predetermined electromagnetic energy intensity range, the intensity of said predetermined electromagnetic energy intensity range diminishing from layer to layer in a predetermined direction; and
    (b) a layer of highly electrically conductive material on the outer surfaces of said laminated member.

10. A shield material as set forth in claim 9 wherein said ferromagnetic material is taken from the class consisting of permendur and nickel-iron containing alloys having from about 42 to about 80 weight percent nickel.

11. A shield material as set forth in claim 9 wherein said laminated ember comprises at least three layers.

12. A shield material as set forth in claim 10 wherein said laminated member comprises at least three layers.

13. A shield material as set forth in claim 9 wherein said layer of highly electrically conductive material is copper.

14. A shield material as set forth in claim 10 wherein said layer of highly electrically conductive material is copper.

15. A shield material as set forth in claim 11 wherein said layer of highly electrically conductive material is copper.

16. A shield material as set forth in claim 12 wherein said layer of highly electrically conductive material is copper.

17. A shield material for electromagnetic radiations, comprising:
    (a) a first layer of ferromagnetic material having opposing major surfaces and having a relatively high permeability over a first predetermined electromagnetic energy intensity range; and
    (b) a second layer of ferromagnetic material having opposing major surfaces, one of said major surfaces being contiguous with one of the major surfaces of said first layer, said second layer having a relatively high permeability over a second predetermined electromagnetic energy intensity range different from said first range.

18. A shield material as set forth in claim 17 wherein said second electromagnetic energy intensity range is lower than said first electromagnetic energy intensity range.

19. A shield material as set forth in claim 17 wherein said first layer is taken from the class consisting of permendur and nickel-iron containing alloys having from about 42 to about 80 weight percent nickel.

20. A shield material as set forth in claim 18 wherein said first layer is taken from the class consisting of permendur and nickel-iron containing alloys having from about 42 to about 80 weight percent nickel.

21. A shield material for electromagnetic radiations comprising:
    a laminated member comprising a plurality of contiguous layers of ferromagnetic material, each said layer of ferromagnetic material having a predetermined high permeability over a predetermined electromagnetic energy intensity range, the intensity of said predetermined electromagnetic energy intensity range diminishing from layer to layer in a predetermined direction.

22. A shield material as set forth in claim 21 wherein said ferromagnetic material is taken from the class consisting of permendur and nickel-iron containing alloys having from about 42 to about 80 weight percent nickel.

23. A shield material as set forth in claim 21 wherein said laminated member comprises at least three layers.

24. A shield material as set forth in claim 22 wherein said laminated member comprises at least three layers.

25. A method of shielding against electromagnetic radiations, comprising the steps of:
(a) determining the direction of electromagnetic radiations to be shielded;
(b) providing an electromagnetic shielding material comprising a plurality of adjacent members of ferromagnetic material, each said member of ferromagnetic material having a predetermined high permeability over a predetermined electromagnetic energy intensity range, the intensity of said predetermined electromagnetic energy intensity range diminishing from member to member in a predetermined direction and a highly electrically conductive material on opposed sides of said ferromagnetic material; and
(c) positioning said shielding material so that said electromagnetic radiations to be shielded impinge upon said members in the order of higher to lower predetermined electromagnetic energy intensity range.

26. A method as set forth in claim 25 wherein said ferromagnetic material is taken from the class consisting of permendur and nickel-iron containing alloys having from about 42 to about 80 weight percent nickel.

27. A method as set forth in claim 25 wherein said plurality of members comprises at least three such members.

28. A method as set forth in claim 26 wherein plurality of members comprises at least three such members.

29. A method as set forth in claim 25 wherein said highly electrically conductive material is copper.

30. A method as set forth in claim 26 wherein said highly electrically conductive material is copper.

31. A method as set forth in claim 27 wherein said highly electrically conductive material is copper.

32. A method as set forth in claim 28 wherein said highly electrically conductive material is copper.

* * * * *